United States Patent
Mickel et al.

(10) Patent No.: US 8,835,272 B1
(45) Date of Patent: Sep. 16, 2014

(54) PASSIVE ELECTRICALLY SWITCHABLE CIRCUIT ELEMENT HAVING IMPROVED TUNABILITY AND METHOD FOR ITS MANUFACTURE

(71) Applicant: Sandia Corporation, Albuquerque, NM (US)

(72) Inventors: Patrick R. Mickel, Albuquerque, NM (US); Conrad D. James, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 0 days.

(21) Appl. No.: 13/780,262

(22) Filed: Feb. 28, 2013

(51) Int. Cl.
*H01L 21/20* (2006.01)
*H01L 45/00* (2006.01)

(52) U.S. Cl.
CPC .............. *H01L 45/08* (2013.01); *H01L 45/085* (2013.01); *H01L 45/1608* (2013.01)
USPC ........ 438/382; 257/2; 257/537; 257/E45.003; 257/E21.006

(58) Field of Classification Search
CPC .............................. H01L 45/08; H01L 45/085
USPC ........ 438/382; 257/2, 537, E45.003, E21.006
See application file for complete search history.

(56) References Cited

U.S. PATENT DOCUMENTS

| 2010/0200828 | A1* | 8/2010 | Tominaga et al. | 257/2 |
| 2012/0267598 | A1* | 10/2012 | Sakotsubo et al. | 257/4 |
| 2013/0112936 | A1* | 5/2013 | Wei et al. | 257/4 |
| 2013/0153845 | A1* | 6/2013 | Wang et al. | 257/2 |
| 2013/0314973 | A1* | 11/2013 | Meade et al. | 365/148 |
| 2014/0003139 | A1* | 1/2014 | Pickett et al. | 365/159 |
| 2014/0027702 | A1* | 1/2014 | Lu et al. | 257/4 |
| 2014/0027705 | A1* | 1/2014 | Yang et al. | 257/5 |
| 2014/0063924 | A1* | 3/2014 | Nakai et al. | 365/158 |

OTHER PUBLICATIONS

Chua, L, et al, "Memristive devices and systems," Proceedings of the IEEE, 1976; 64(2): 209-223.
Chua, L., "Memristor—The missing circuit element," Circuit Theory, IEEE Transactions on, 1971; 18(5): 507-519.
Jo, S. et al., "Nanoscale Memristor Device as Synapse in Neuromorphic systems," Nano Letters, 2010; 10(4): 1297-1301.
Kwon, D., et al., "Atomic structure of conducting nanoflilaments in TiO2 resistive switching memory," Nat Nano, 2010; 5(2): 148-153.
Liu, Q., et al., "Controllable Growth of Nanoscale Conductive Filaments in Solid-Electrolyte-Based ReRAM by Using a Metal Nanocrystal Covered Bottom Electrode," ACS Nano; 2010, 4(10): 6162-6168.
Sheridan, P., et al., "Device and SPICE modeling of RRAM devices," Nanoscale, 2011; 3(9): 3833-3840.
Strukov, D and Williams, "Exponential ionic drift: fast switching and low volatility of thin-film memristors," Applied Physics A: Materials Science & Processing, 2009; 94(3): 515-519.

(Continued)

*Primary Examiner* — William F Kraig
*Assistant Examiner* — Joseph C Nicely
(74) *Attorney, Agent, or Firm* — Helen S. Baca

(57) ABSTRACT

A resistive switching device and methods for making the same are disclosed. In the above said device, a resistive switching layer is interposed between opposing electrodes. The resistive switching layer comprises at least two sub-layers of switchable insulative material characterized by different ionic mobilities.

14 Claims, 5 Drawing Sheets

(56) References Cited

OTHER PUBLICATIONS

Waser, R. and Aono, M., "Nanoionics-based resistive switching memories," Nat Mater, 2007; 6(11): 833-840.

Waser, R. et al., "Redox-Based Resistive Switching Memories—Nanoionic Mechanisms, Prospects, and Challenges," Advanced Materials, 2009; 21(25-26): 2632-2663.

Yang, J. et al., "Memristive switching mechanism for metal/oxide/metal nanodevices," Nat Nano, 2008; 3(7): 429-433.

* cited by examiner

PASSIVE ELECTRICALLY SWITCHABLE CIRCUIT ELEMENT HAVING IMPROVED TUNABILITY AND METHOD FOR ITS MANUFACTURE

STATEMENT OF GOVERNMENT INTEREST

This invention was developed under Contract DE-AC04-94AL85000 between Sandia Corporation and the U.S. Department of Energy. The U.S. Government has certain rights in this invention.

TECHNICAL FIELD

The present invention is directed generally to electrical and electronic devices that exhibit resistive switching.

ART BACKGROUND

A memristor is a circuit element whose electrical resistance is determined by its previous current-voltage history in such a way that an applied voltage of sufficient magnitude can switch it between a high-conductance state and a low-conductance state. It is typically fabricated as a passive two-terminal resistive switching element in which a thin insulating film is sandwiched between two conductors. The insulating film is typically composed of a transition-metal oxide (TMO) containing mobile oxygen ions and oxygen vacancies. Typical TMOs used for this purpose are $TiO_2$, $Ta_2O_5$, $WO_3$, $HfO_2$, NiO, and $Nb_2O_5$.

Memristors have also been referred to as "resistive random access memories," abbreviated "ReRAMs" or "RRAMs". A memcapacitor is an analogous device in which practical application is made of switched capacitance rather than resistance.

Relatively large signal voltages, typically greater than one volt, are used to change the resistive or capacitive state of the device, which can be read at low signal levels, typically less than one volt, without erasing the state of the device.

Although research on memcapacitors is still at an early stage, memristors have been extensively studied and have been proposed for the future replacement of flash memory and for other applications such as neuromorphic synapses. Memristors are especially promising for applications in low energy information storage because of their passive, non-volatile properties. By defining the low resistance state as "on," and the high resistance state as "off", each memristor can store one bit of digital information. There have also been proposals to store multiple bits in a single memristor element by switching the element among a multiplicity of states that include one or more states between "full on" and "full off". For neuromorphic applications, a continuum of resistance states might be available, which could emulate the function of synapses in biological systems.

However, the practical realization of multi-bit and analog function has been hindered by the fact that much of the observed resistance change is significantly non-linear and occurs over a small fraction of the switching time. This makes it difficult to exert the needed amount of control over the tuning among different memory states. There is also a need to improve device-to-device reliability and reproducibility of memristors before they will be widely adopted into industry.

SUMMARY OF THE INVENTION

We have found a new approach to memristor design and fabrication that can provide greater control over the tuning of the resistance state of the device, and that can also improve device-to-device reliability and reproduceability. Applications of our new approach are not limited to memristors, but also include memcapacitors.

It is known that high-conductance filaments tend to grow within the thin insulating film. That is, the film behaves as an ionic conductor, within which filaments formed from oxygen vacancies or metallic ions grow from one electrode toward the other under stimulation by an applied voltage of sufficient strength. When as few as one filament bridges the gap between the electrodes, an electrical short can form across the insulating layer, thereby switching the element to a state of lower resistance.

As the leading end of a filament growing from one electrode gets closer to the opposite electrode, the electric field promoting its growth gets stronger. As a consequence, the few filaments that undergo the earliest initial growth will enjoy an increasing advantage as they continue to grow ahead of those behind them. This field magnification effect exacerbates small differences in the early growth of the various filaments and leads to high variability in the extent to which the various filaments have grown when the first filament has bridged the gap. If this effect can be suppressed, however, more uniform filamentary growth fronts can be achieved. This, in turn, affords greater control over the resistance tuning and greater uniformity among the individual elements that are produced from, e.g., a wafer-scale process.

We found that the field magnification effect can be suppressed by incorporating in the insulating layer between at least two sublayers having different ionic mobilities relative to the ions that contribute to filamentary growth. In embodiments, a plurality of such sublayers alternate between higher mobility and lower mobility compositions. In embodiments, the concentration of lower-mobility sublayers increases in the normal direction, i.e. along the direction of filamentary growth.

Accordingly, the invention in one embodiment involves apparatus comprising a resistive switching layer interposed between opposing electrodes, wherein the resistive switching layer comprises at least two sub-layers of switchable insulative material characterized by different ionic mobilities. In another embodiment, the invention involves a method for making a resistive switching device, comprising depositing a lower electrode layer on a substrate, forming over the lower electrode layer in contiguous sequence at least two sub-layers of switchable insulative material characterized by different ionic mobilities, and depositing an upper electrode layer over the sub-layers of switchable insulative material.

DETAILED DESCRIPTION

Two classes of memristors have garnered particular interest: the electrochemical mechanism class (ECM), and the valence change mechanism class (VCM). The resistance switching in both classes is driven by ionic transport through an insulating matrix under an applied electric field.

In the ECM class, an active electrode donates electrochemically active ions (e.g., Cu, Ni, or Ag) which are reduced and typically metalized once they diffuse to an opposing inert electrode (of, e.g., Pt or W). In VCM systems, oxygen vacancies are the mobile ions, which dope oxide layers resulting in higher local conductance.

Figure 1:
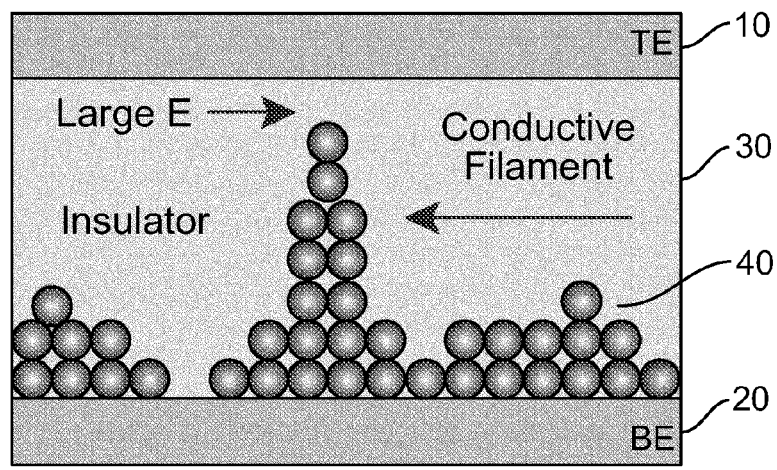
FIG. 1 is a schematic drawing, in cross section, of a typical memristor structure, including an illustration of filamentary growth.

FIG. 1 provides a schematic view of the basic structure of a filament-based memristor device.

As seen in FIG. 1, electrodes 10, 20 are separated by an electrical insulating layer 30 that is an ionic conductor. Within the insulating layer, high conductance filaments can form from oxygen vacancies (VCM) or metallic ions (ECM), all collectively referred to here as "ionic species". In ECM memristors, the metallic ions may be donated by an active electrode, whereas in VCM memristors, both electrodes are passive, i.e., chemically inert.

When a voltage is applied between the top (10) and bottom (20) electrodes, mobile carriers drift through the insulating matrix under the electric field. Eventually, these carriers form the conductive filaments, which may eventually connect the electrodes resulting in a sharp reduction in resistance. Due to the stochastic nature of filament formation, these conductive filaments have random lengths and distributions. Filaments also grow at different rates due to natural variations in the local ionic conductivity of the insulating matrix.

Electric field strengths are higher (and thus growth rates tend to be faster) for longer filaments due to their closer proximity to the target electrode. Consequently, the field that drives the growth of a particular filament will tend to be amplified as the filament grows, causing small statistical fluctuations in filament growth early in the process to be magnified for longer filaments, which further increases their separation from shorter filaments.

The net result is a length distribution of filaments that is highly non-uniform, with one long filament that shorts between the electrodes and a large population of short filaments. This non-uniform conduction front of filaments results in devices with switching properties that strongly depend on random variations within the insulating matrix. Our design improvement is aimed at suppressing the field magnification effect.

Our approach is to incorporate layers of contrasting ionic mobility within the structure of the insulating layer, and by that means to suppress the field amplification and enhance the uniformity of filamentary growth. We believe that the low mobility layers will temporarily slow the growth of longer filaments, allowing shorter filaments to advance. Thus, the difference in filament lengths will be reduced, and because the accelerative effect of field amplification is suppressed, the shorter filaments will be able to maintain growth rates comparable to those of the longer filaments. By optimizing the thickness and spacing of the low mobility regions, we believe that the field-amplification effect can be substantially offset in at least some implementations.

Figure 2:
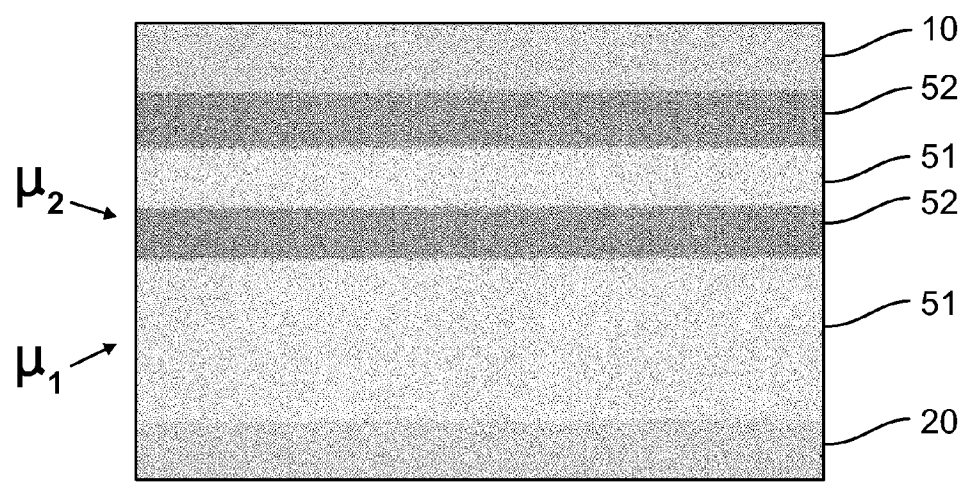
FIG. 2 schematically illustrates an illustrative embodiment of the present invention in which sublayers having different ionic mobilities are incorporated in the switching layer.

Thus, for example, FIG. 2 provides a schematic view of a multilayered structure in which sublayers 51, 52 of materials having two different ionic mobilities $\mu_1$, $\mu_2$ respectively, have been incorporated in the switching layer.

Designs and fabrication sequences for conventional memristors are well known in the art and need not be described here in detail. Very briefly, a switching layer of, e.g., a TMO, typically tens to hundreds of nanometers in thickness, is enclosed between lower and upper metal electrodes. Without limitation, possible electrode materials include tungsten, aluminum, titanium nitride, gold, platinum, iridium, nickel, and tantalum. The various layers are deposited, e.g., on a silicon substrate that may be highly doped to provide back-side electrical contact. Memristors have been fabricated using conventional CMOS techniques. Thus, for example, the electrode layers and the switching layer may be deposited by sputtering. Other techniques that are readily available and may be useful for forming certain of the layers include, without limitation, reactive sputtering, chemical vapor deposition, and atomic layer deposition.

In a departure from conventional memristor fabrication techniques, our method includes the formation of sublayers that have different ionic mobilities. In implementations, the switching layer incorporates sublayers having two different ionic mobilities. The total number of sublayers may be as few as two, or there may be as many as ten sublayers, or even more. For at least some applications, switching layers that incorporate sublayers having even more than two different ionic mobilities may also be useful.

The specific technique used to form the various sublayers may depend, at least in part, on the thickness selected for those sublayers. Thus, for example, methods that might be appropriate for forming thicker layers include sputtering, molecular beam epitaxy, and atomic layer deposition, whereas preferable methods for forming thinner layers might include molecular beam epitaxy and atomic layer deposition. Of course, various combinations of growth techniques could be advantageous.

It may be advantageous to add an extended lower electrode layer consisting of insulator co-deposited with atoms of the same metal of which the lower electrode is composed. As is known in the art, such an extended layer can serve as a source of ions for filamentary growth. Although such layers in known implementations will feed the growth of one filament (or at most a few filaments), such a layer may be even more important as a source for the simultaneous growth of many filaments. For such purpose, it is desirable for the extended layer to be rich enough in electrode material to serve, effectively, as a non-depleting source. For example, using a silver lower electrode in a memristor having a single ionic mobility, we have used sputtering to co-deposit silver and silicon dioxide in extended layers about 50 nm thick. We found molecular ratios of silver to insulator in the range 1:2 to 1:8 to be effective, with a preferred ratio of 1:8. Another exemplary system for the extended layer is silver co-deposited with germanium selenide Various known techniques may be applied, singly or in combination, to control the ionic mobilities in the respective sublayers. One such technique is to create sublayers whose microscopic structure contains defects in the form of interstitial atoms. An example is titanium dioxide with strontium interstitials. Another example is to vary the concentrations of grain boundaries in the respective sublayers. This can be done, e.g., by controlling growth parameters such as temperature and ambient pressure. Yet another example is to select alternating materials that have different annealing temperatures, so that grain boundaries may be selectively removed in one of the two ionic conductors via annealing, providing direct layer-selective tuning of ionic mobility.

The advantages of our new method are illustrated by the results of a set of numerical simulations that we performed. For a conventional switching layer and for a multi-layered switching layer as described here, we computed filament growth rates using local values for ionic mobilities and electric fields. We added a Gaussian distribution of local corrections to emulate irregularities such as grain boundaries, interstitials, and trapped charge.

Our simulation computed growth rates for one hundred independent filaments of respective lengths $l_n$, n=1, . . . 100, where n=1:100) based on an activation model in which filament lengths increase as ions preferentially hop toward the filament tips under applied bias. The model is expressed by:

$$\frac{\partial l}{\partial t} = d\omega \left( e^{\frac{-qU_a + qVd/2(h-l)}{k_B T}} - e^{\frac{-qU_a - qVd/2(h-l)}{k_B T}} \right) \quad (1a)$$

$$\frac{\partial l}{\partial t} = \mu E_0 \sinh\left(\frac{E}{E_0}\right) \quad (1b)$$

In Eq. 1a, d is the hopping site distance, $\omega$ is the characteristic ion hop attempt frequency, $U_a$ is the activation potential, V is the applied voltage across the insulating matrix, h is the thickness of the device, l is the filament length, $k_B T$ represents the thermal energy, q is the ionic charge, and the second exponential term accounts for reverse hopping.

Equation 1b offers a conceptually simpler representation wherein the prefactors are combined into an effective mobility, $\mu = q\omega d^2 \exp[-qU_a/k_B T]/k_B T$, and characteristic field, $E_0 = 2k_B T/(qd)(E = V/(h-l))$.

The large, non-physical hopping distances derived from activation models, d~3 nm, have led some to suggest that linear ionic drift in an electric field may be more plausible. We therefore have repeated our simulations using a linear ionic drift model and obtained similar results.

The simulated filaments grow uniaxially through an ionic conducting medium in which the ionic mobility at each point is determined by a Gaussian distribution in order to emulate local irregularities such as grain boundaries, interstitial atoms, trapped charge, and other factors. The subscript i has been omitted from the equations to simplify the notation. It will be understood, however, that the variable l and the parameter $\mu$ are indexed by i.

As noted above, FIG. 2 provides a schematic view of a multilayered structure with materials having different ionic mobilities $\mu_1, \mu_2$. Two important factors in the simulations are the ratio of the layers' ionic mobilities and the spacing and arrangement of the layers in the z-dimension, i.e., along the axis normal to the substrate on which the layers are disposed.

Figure 3:
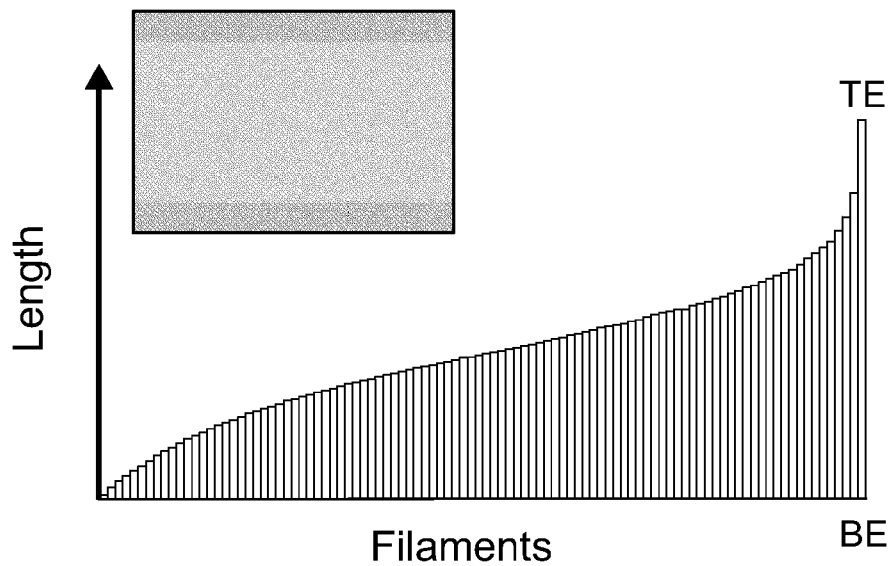
FIG. 3 is a graphical representation of the distribution of filamentary lengths as computed in a numerical simulation of a filamentary resistive switching event in a conventional memristor switching layer.

FIG. 3 shows the filamentary length distribution, ordered from shortest to longest, in a modeled filamentary resistive switching event in the conventional layer. At such an event, the first filament or group of filaments has grown long enough to bridge the gap between the electrodes. At the switching event, we found a mean filament length of 40% of the device thickness, with a relative standard deviation of 45%. It should be noted that these values are not based on a single event, but rather resulted from averaging over an ensemble of starting conditions, each characterized by a random distribution of the local corrections mentioned above.

Figure 4:
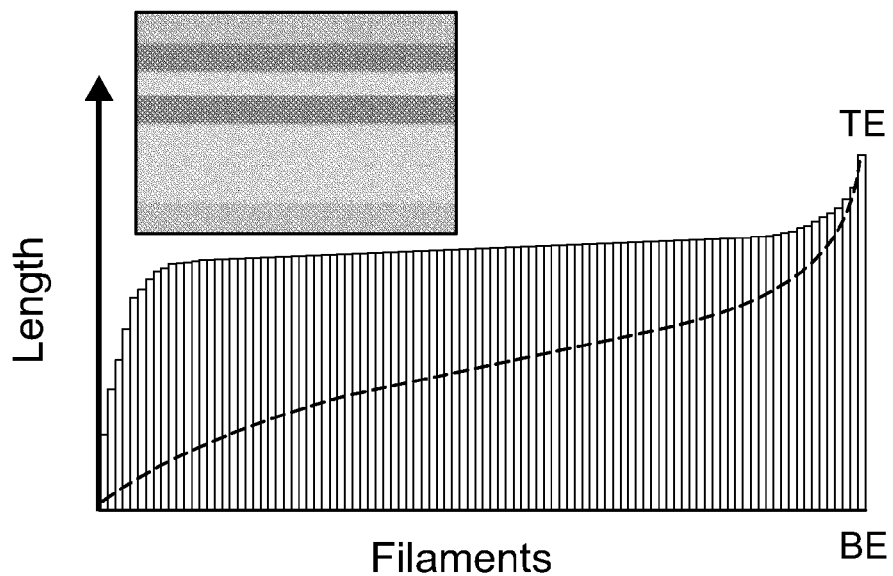
FIG. 4 is a graphical representation of the distribution of filamentary lengths as computed in a numerical simulation of a filamentary resistive switching event in a switching layer that is a matrix of multiple sublayers having different ionic mobilities.

FIG. 4 represents a modeled filamentary resistive switching event in a switching layer that is a matrix of multiple sublayers as described here. Again, the filaments have been sorted by length in ascending order for clarity. In contrast to the conventional switching layer, we found that in an optimized design, the multilayer matrix yielded an average filament length that was 79% of the insulating matrix thickness, with a relative standard deviation of only 12%. Again, these values resulted from ensemble averaging as described above. The inset in the figure illustrates the approximate multi-layer design (layer number and position) used to obtain the optimized performance quoted above.

Figure 5:
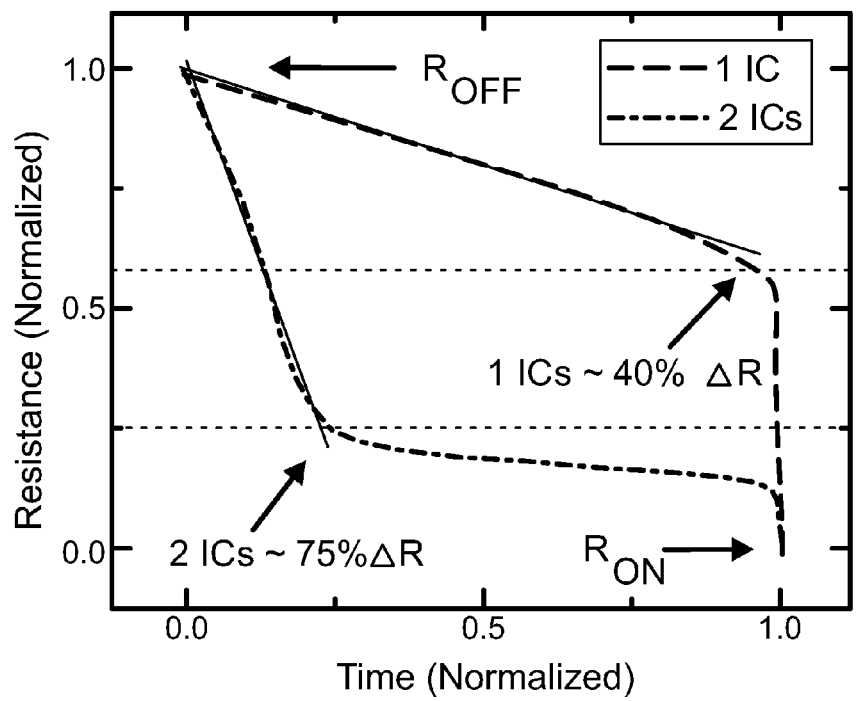
FIG. 5 is a plot of resistance versus time during a resistive switching event, obtained from simulations of, respectively, a single-ionic-conductor memristor (upper curve) and a memristor having two different ionic conductors (lower curve).

FIG. 5 is a plot of resistance versus time during a resistive switching event, obtained from simulations of, respectively, a single-ionic-conductor memristor (upper curve) and a memristor having two different ionic conductors (lower curve). The figure demonstrates that by using a multilayer matrix for the switching layer of a memristor, it is theoretically possible to increase the linear tuning range by as much as 75% or even more.

In the computations from which FIG. 5 was derived, resistance and time were both normalized to compare the linear tuning range of resistance for different device designs. The design parameters for this simulation were chosen to maximize the increase of linear tuning range as well as decrease the device-to-device variability. (The layer-thickness parameter was 20% of the device thickness; the layer-position parameter was 1.6. These parameters are explained in greater detail below.)

Figure 6:
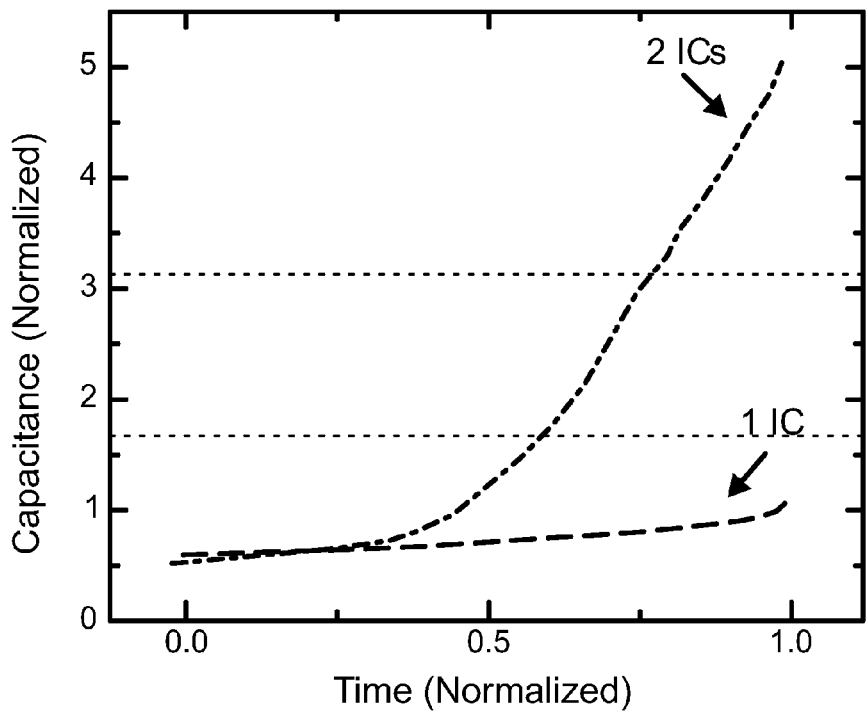
FIG. 6 is a plot of capacitance versus time during a resistive switching event, obtained from simulations of, respectively, a single-ionic-conductor memristor (lower curve) and a memristor having two different ionic conductors (upper curve).

It should be noted in this regard that the achievement of a uniform conduction front not only affects the memristive properties of the device, but the memcapacitive properties as well. Thus, for example, FIG. 6 is a plot of capacitance versus time during a resistive switching event, obtained from simulations of, respectively, a single-ionic-conductor memristor (lower curve) and a memristor having two different ionic conductors (upper curve). The figure demonstrates that the range of capacitance values that is theoretically achievable using a multilayer matrix for the switching layer of a memristor is more than 400% larger than for a conventional, single-ionic-conductor memristor.

The simulated device performances illustrated above were achieved by optimizing three parameters: the sublayer thickness, the total number of sublayers, and a parameter that characterized the sublayer concentration profile, i.e., the number of sublayers per unit distance in the z-dimension. We took an approach in which concentration profiles of the form $c(z)=z^n$, were modeled for a range of values of the exponent n. For each concentration profile, we investigated a phase space having the dimensions of layer position LP (each specified value of which, given a concentration profile, determines a spacing and concentration of all layers) and layer thickness $\delta$.

Figure 7:
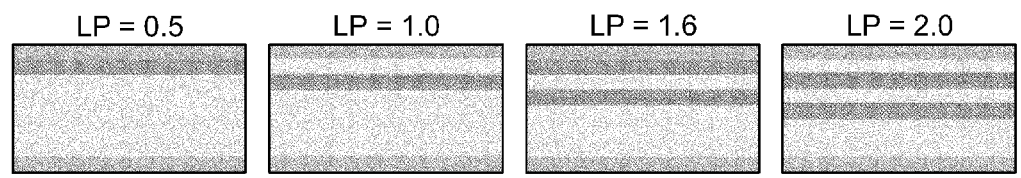
FIG. 7 is a schematic illustration of several possible sublayer distributions within the switching layer, which illustrate respective exemplary settings for the layer-position parameter that was used in our simulations.

A better understanding of the layer-position parameter LP is achieved with reference to FIG. 7, which illustrates several example settings for the layer position. The rounded value of LP is an integer that specifies the number of layers of alternate ionic mobility that are incorporated in the switching layer. The remaining (positive or negative) fractional part of LP is an offset by which the sequence of layer positions is shifted along the layer profile. In the event that layers overlap, each resulting composite layer is treated as a single layer.

An exemplary optimization procedure begins by assuming the alternate mobility layers have equal thicknesses. The alternate mobility layer positions are mapped according to the generic power-law concentration profile $c(z)=z^n$. (Similar results were obtained for most values of n such that $|n|>1$). The mapping rule specifies that for a total number NL of layers, the first layer is centered at the value of z where the integral of $c(z)$ equals 1/NL, the second layer is centered where the integral equals 2/NL, etc.

Figure 8:
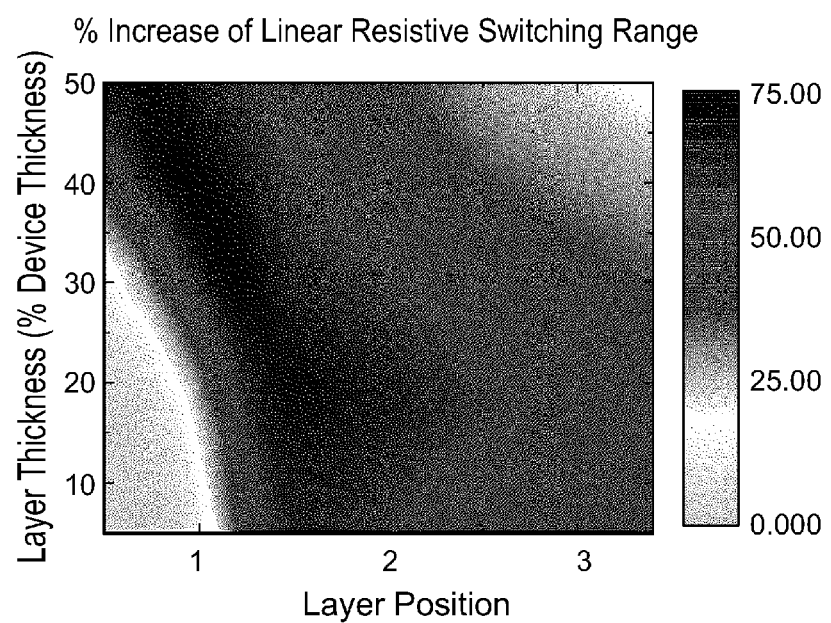
FIG. 8 illustrates the result of calculations for optimizing a multilayer memristor design, in which the figure of merit to be optimized was the ratio of linear switching ranges, i.e., that portion of the resistive switching range for which the resistance state changes linearly in time under applied voltage for the multilayer memristor, relative to the same figure for the single-ionic-conductor memristor.
Figure 9:
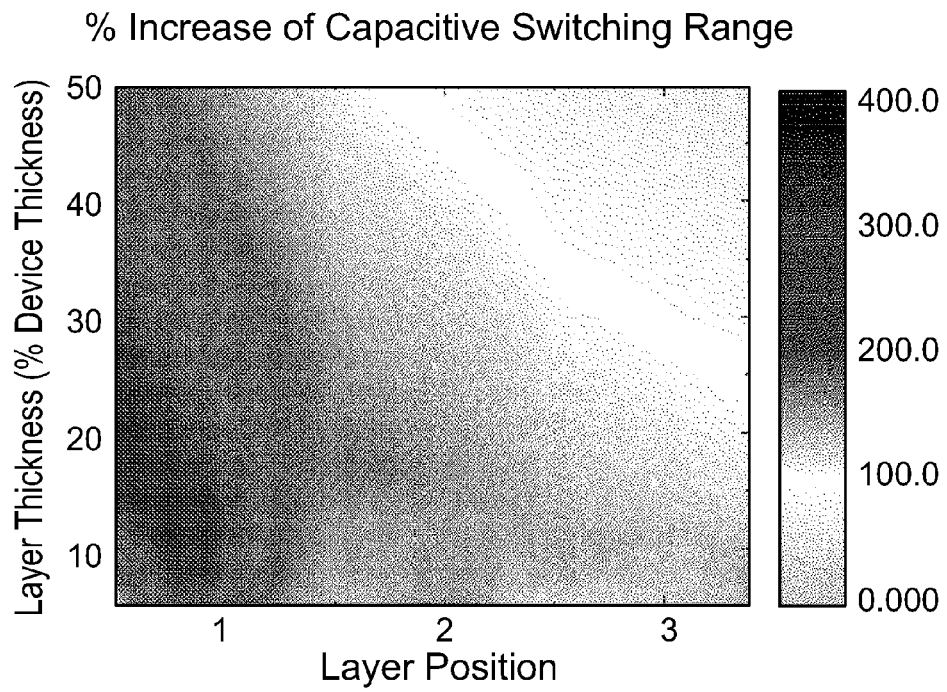
FIG. 9 illustrates the result of calculations for optimizing a multilayer memristor design, in which the figure of merit to be optimized was the ratio of capacitance switching ranges, computed in analogous fashion to the ratio of linear switching ranges of the preceding figure.
Figure 10:
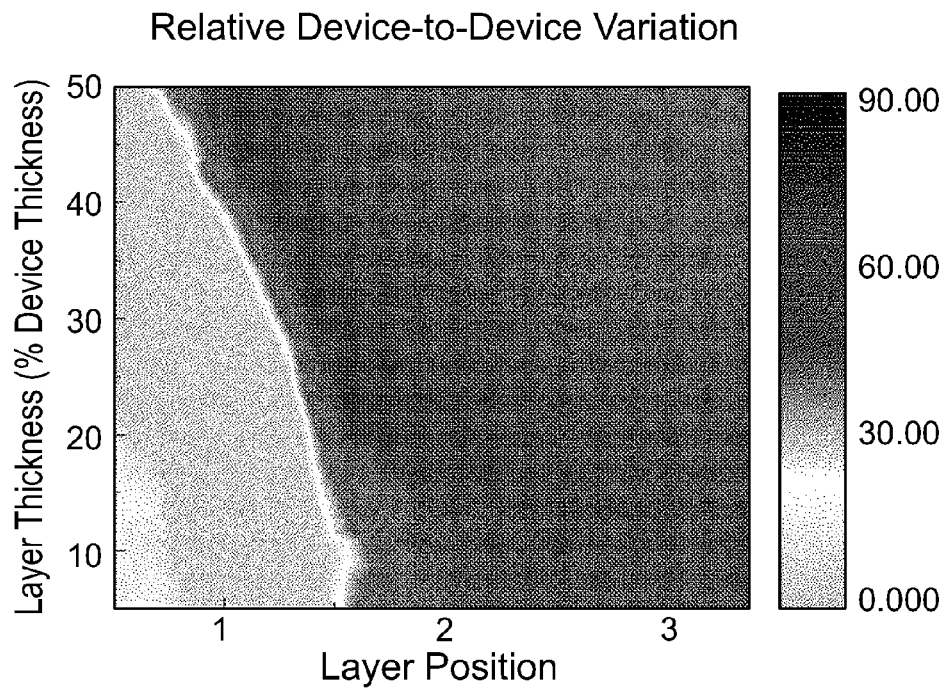
FIG. 10 illustrates the result of calculations for optimizing a multilayer memristor design, in which the figure of merit to be optimized was the ratio of relative standard deviations (RSDs) of the linear resistive switching range, i.e., the RSD (measured from ensemble calculations) of the linear resistive switching range for the multilayer memristor, relative to the same figure for the single-ionic-conductor memristor.

FIGS. 8, 9, and 10 illustrate some of our optimization results, in which different figures of merit were optimized. In FIG. 8, the figure of merit was the ratio of linear switching ranges, i.e., that portion of the resistive switching range for which the resistance state changes linearly in time under applied voltage for the multilayer memristor, relative to the same figure for the single-ionic-conductor memristor. In FIG. 9, the figure of merit was the ratio of capacitance switching ranges, computed in analogous fashion to the ratio of linear switching ranges.

It will be understood from FIG. 8 that as the number of alternate ionic layers increases, the ionic mobility contrast decreases and approaches a single layer device. An optimal design is found between the two limits of single-layer devices of either ionic conductor.

In FIG. 10, the figure of merit was the ratio of relative standard deviations (RSDs) of the linear resistive switching range, i.e., the RSD (measured from ensemble calculations) of the linear resistive switching range for the multilayer memristor, relative to the same figure for the single-ionic-conductor memristor. FIG. 10 demonstrates, in particular, a decrease in the theoretical variability of device performance using the multilayer design.

More specifically, to obtain the results shown in FIG. 10, we simulated the switching of different devices by running multiple simulations (n=1000) with independent Gaussian distributions of local ionic conductivities in order to calculate the standard deviation of the range of resistance modulation for a large population of simulated device switchings. The standard deviation of the linear range of resistance was calculated. As FIG. 10 shows, the results predicted that the standard deviation could be reduced to as little as 10% of the variability observed in single layer devices (a 90% reduction).

With further reference to FIGS. 8-10, we note that the pertinent figure of merit as displayed in FIG. 8 is greatest in a diagonal band beginning in the upper left-hand corner of the figure and extending in the direction of lower layer thickness and higher layer position; as displayed in FIG. 9 it is greatest in an island region near the lower left-hand corner of the figure; as displayed in FIG. 10 it is greatest in a diffuse band extending from a layer position of about 1 and a layer thickness of about 50 to a layer position of about 1.7 and a layer thickness of about 20. The pertinent figure of merit as displayed in FIG. 8 is least in the lower left-hand corner of the figure; as displayed in FIG. 9 it is least in the upper right-hand corner of the figure; as displayed in FIG. 10 it is least in a band extending from the upper left-hand corner of the figure to a layer position of about 1.2 and a layer thickness of zero.

It should be noted that the design phase-space contours are sensitive to the material properties of the ionic conductor layers, and that the characteristics of the alternate ionic conductor layers introduce additional potential design variables such as the ratios of ionic mobilities ($\mu_2/\mu_1$), electronic resistivities ($\rho_2/\rho_1$), and dielectric permittivities ($\epsilon_2/\epsilon_1$) of the respective ionic conductor layers.

For the design phase spaces illustrated here, we used the following ratios: $\mu_2/\mu_1=1/100$, $\rho_2/\rho_1=1/2$, and $\epsilon_2/\epsilon_1=1$. Similar results were obtained for simulations with $\rho_2/\rho_1=1$. However, we chose a smaller value because ionic mobility correlates inversely with electronic conductivity.

What is claimed is:

1. Apparatus comprising a resistive switching layer interposed between opposing electrodes, wherein the resistive switching layer comprises a plurality of alternating sub-layers of switchable insulative material, wherein at least two sub-layers of switchable insulative material are characterized by different ionic mobilities, and wherein a conductive filament or a plurality of conductive filaments are formed when voltage is applied between the opposing electrodes.

2. The apparatus of claim 1, wherein the sub-layers alternate between a material of higher ionic mobility and a material of lower ionic mobility.

3. The apparatus of claim 1, wherein sub-layers of a first material having a first ionic mobility are interposed by sub-layers of a second material having a second ionic mobility.

4. The apparatus of claim 3, wherein the layers of the second material are spaced at intervals that depend on position in the normal direction within the switching layer.

5. The apparatus of claim 1, wherein at least two said materials characterized by different ionic mobilities have different densities of grain boundaries.

6. The apparatus of claim 1, wherein at least one said resistive switching layer is conformed to provide a switchable resistance in an electronic circuit.

7. The apparatus of claim 1, wherein at least one said resistive switching layer is conformed to provide a switchable capacitance in an electronic circuit.

8. A method for making a resistive switching device, comprising depositing a lower electrode layer on a substrate, forming over the lower electrode layer in contiguous sequence a plurality of alternating sub-layers of switchable insulative material, wherein at least two sub-layers of switchable insulative material are characterized by different ionic mobilities, and depositing an upper electrode layer over the sub-layers of switchable insulative material, wherein a conductive filament or a plurality of conductive filaments forms when voltage is applied between the lower electrode layer and the upper electrode layer of the resistive switching device.

9. The method of claim 8, wherein the forming step comprises forming, in alternation, sub-layers having a respective first and second ionic mobility.

10. The method of claim 8, further comprising, during the forming step, regulating the thicknesses of the sub-layers such that the sub-layers of at least one said switchable insulative material are spaced at intervals that depend on distance from the substrate.

11. The method of claim 8, wherein the forming step comprises annealing the sub-layers.

12. The method of claim 11, wherein the annealing is carried out so as to induce a different density of grain boundaries in each of at least two said switchable insulative materials.

13. The method of claim 8, further comprising completing the manufacture of an electronic circuit in which at least one said resistive switching device is conformed to provide switchable resistance.

14. The method of claim 8, further comprising completing the manufacture of an electronic circuit in which at least one said resistive switching device is conformed to provide switchable capacitance.

* * * * *